FLUX OF LIQUID →

FLUX OF HEAT →

TEMPERATURE GRADIENT ⟹

INVENTOR.
ZBIGNIEW O. J. STACHURSKI
BY
Seidel & Gonda
ATTORNEYS.

Dec. 5, 1967 | Z. O. J. STACHURSKI | 3,356,539

THERMOELECTRIC GENERATOR

Filed Nov. 5, 1962 | 4 Sheets-Sheet 2

INVENTOR.
ZBIGNIEW O. J. STACHURSKI
BY
Seidel & Gonda
ATTORNEYS.

INVENTOR.
ZBIGNIEW O. J. STACHURSKI
BY Seidel & Gonda
ATTORNEYS.

INVENTOR.
ZBIGNIEW O. J. STACHURSKI
BY Seidel & Gonda
ATTORNEYS.

United States Patent Office 3,356,539

Patented Dec. 5, 1967

3,356,539

THERMOELECTRIC GENERATOR

Zbigniew O. J. Stachurski, 4005 Baltimore Ave., Philadelphia, Pa. 19104

Filed Nov. 5, 1962, Ser. No. 235,580
6 Claims. (Cl. 136—205)

This invention relates to a thermoelectric generator, and more particularly, to apparatus and method for cyclically converting heat into electrical energy.

It is well-known that the flowing of heat in solid conductors or semiconductors can be converted into electricity by reliance on what is generally referred to as the thermoelectric effect. The simplest form of the apparatus or method of the present invention is a thermoelectric element. Two or more thermoelectric elements may be combined to produce a thermoelectric cell. Two or more thermoelectric cells may be combined to produce a thermoelectric battery. Each of the thermoelectric elements are thermoelectric materials, characterized by either positive (p) or negative (n) values of differential Siebeck coefficients.

In a thermoelectric cell, heat may leave the same in two different ways, namely a reversible or irreversible way. Only reversible heat can be useful. Irreversible heat is lost to the environment or to a cooler which may be referred to as a heat sink. The ratio of reversible heat to the total heat introduced to the cell is the efficiency of the cell. Existing thermoelectric cells and thermoelectric generators are extremely inefficient.

According to the present invention, the thermoelectric elements are constructed in a manner so that two juxtaposed streams are flowing in generally opposite directions. One stream is flowing from a heater to a cooler, while the other stream is flowing from the cooler to the heater. Preferably, the fluid, which may be liquid or gaseous, is a closed system. One of the fluid streams will generally be flowing through a thermoelectric material so that at each point along the thermoelectric material, there exists a state close to the thermal equilibrium between the hot and cold streams of fluid. Thus, there will be a heat exchange from one stream to the other stream through the thermoelectric material.

A portion of the total heat introduced into the thermoelectric element will be converted into electricity and substantially the remaining portion of the introduced heat will be conducted to and absorbed by the cold fluid stream instead of being lost in the form of radiation or conduction to the environment. The heat transfer of reversible heat between the hot and cold streams takes place in small increments along the entire length of the thermoelectric material so that substantially all of the heat from the hot stream is converted into electricity or transferred to the cold stream before the hot stream leaves the thermoelectric material.

It is an object of the present invention to provide a novel apparatus and method for generating electricity.

It is another object of the present invention to provide a novel apparatus and method for converting heat into electricity with maximum efficiency.

It is another object of the present invention to provide a thermoelectric element wherein two counter-flowing streams of fluid are juxtaposed so as to facilitate a heat transfer between the streams by conduction through a thermoelectric material.

It is another object of the present invention to provide a thermoelectric cell utilizing at least two counter-flowing streams juxtaposed to a thermoelectric material whereby there will be a heat transfer through the thermoelectric material from one stream to the other.

It is another object of the present invention to provide a thermoelectric element, thermoelectric cell and/or thermoelectric battery wherein substantially all of the heat input will be recaptured or converted into electricity.

It is another object of the present invention to provide a thermoelectric cell with minimum energy loss between a thermoelectric element of the cell and a conductor of the cell.

It is another object of the present invention to provide a novel thermoelectric element, cell and/or battery utilizing a closed continuously circulating fluid system.

Other objects will appear hereinafter.

For the purpose of illustrating the invention, there are shown in the drawings forms which are presently preferred; it being understood, however, that this invention is not limited to the precise arrangements and instrumentalities shown.

Figure 6:
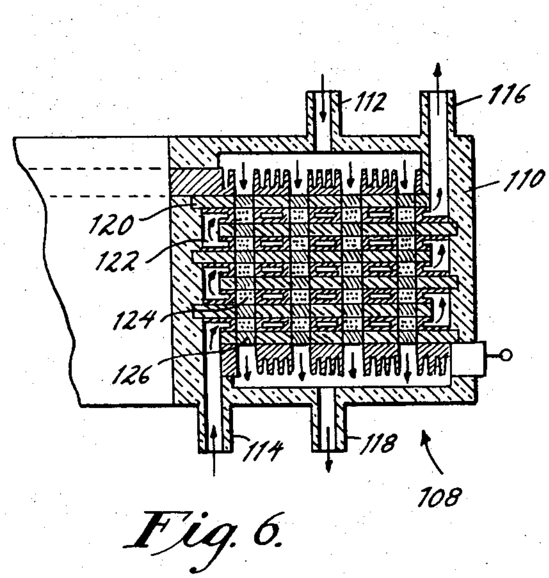
FIGURE 6 is a side elevation view, partly in section, of a thermoelectric element in accordance with another embodiment of the present invention.
Figure 7A:
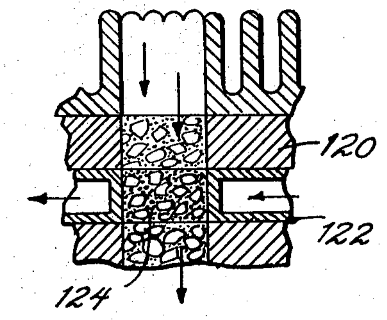

FIGURE 7*a* is an enlarged detail view of a portion of the thermoelectric element illustrated in FIGURE 6.

Figure 7:
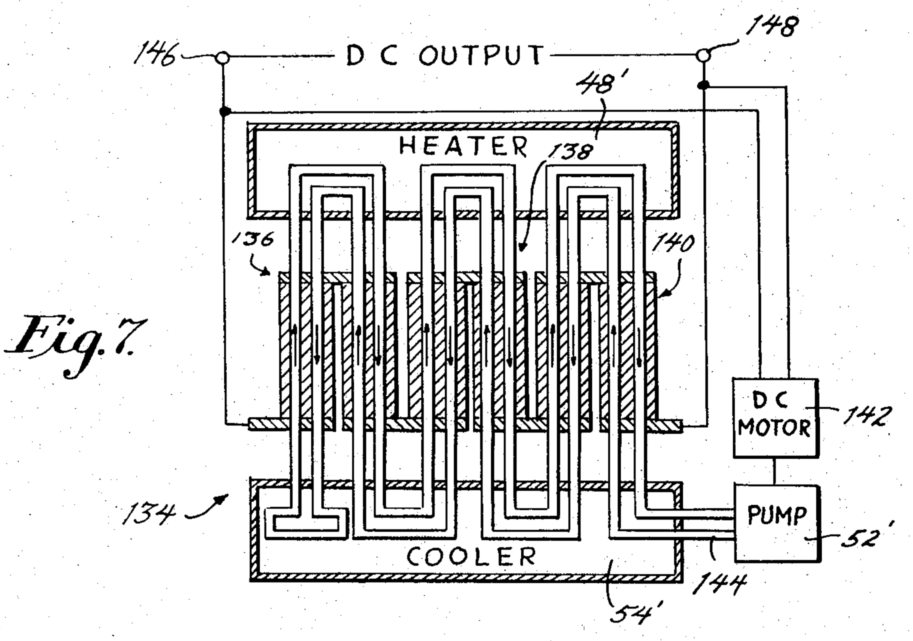

FIGURE 7 is a side elevation view, partly in section, of a thermoelectric battery composed of three thermoelectric cells.

Figures 8A, 8B:
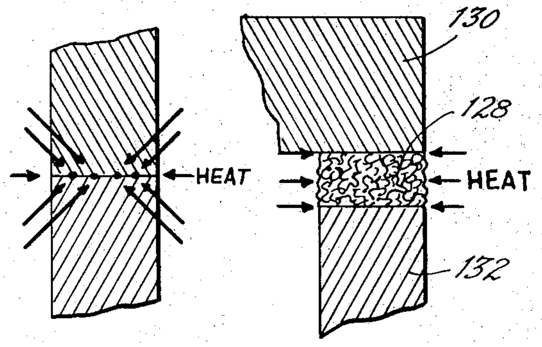

FIGURE 8*a* is a cross sectional view of the joint between a conductor and a thermoelectric material as proposed heretofore by the prior art.

FIGURE 8*b* is a cross sectional view of a joint between a conductor and a thermoelectric material in accordance with another embodiment of the present invention.

Figure 8:
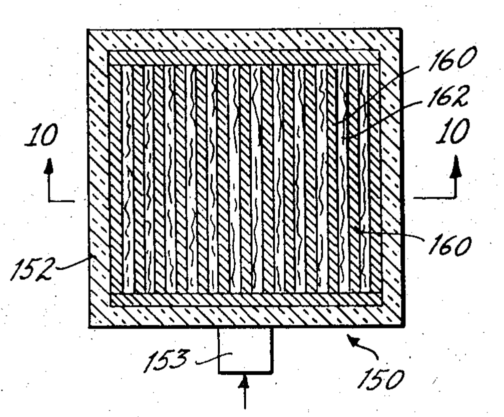

FIGURE 8 is a cross sectional view of a thermoelectric element in accordance with another embodiment of the present invention.

Figure 9:
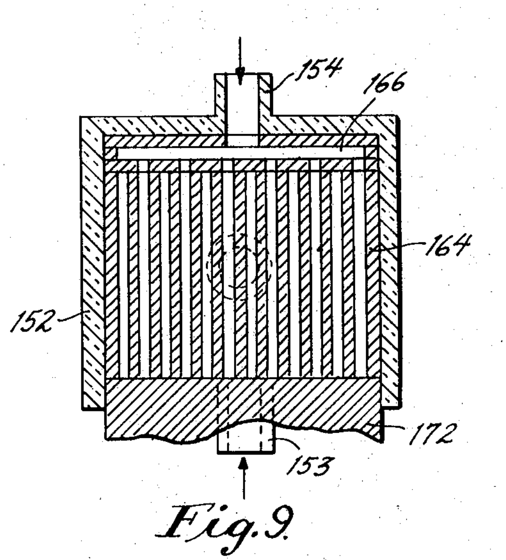
Figures 10, 11:
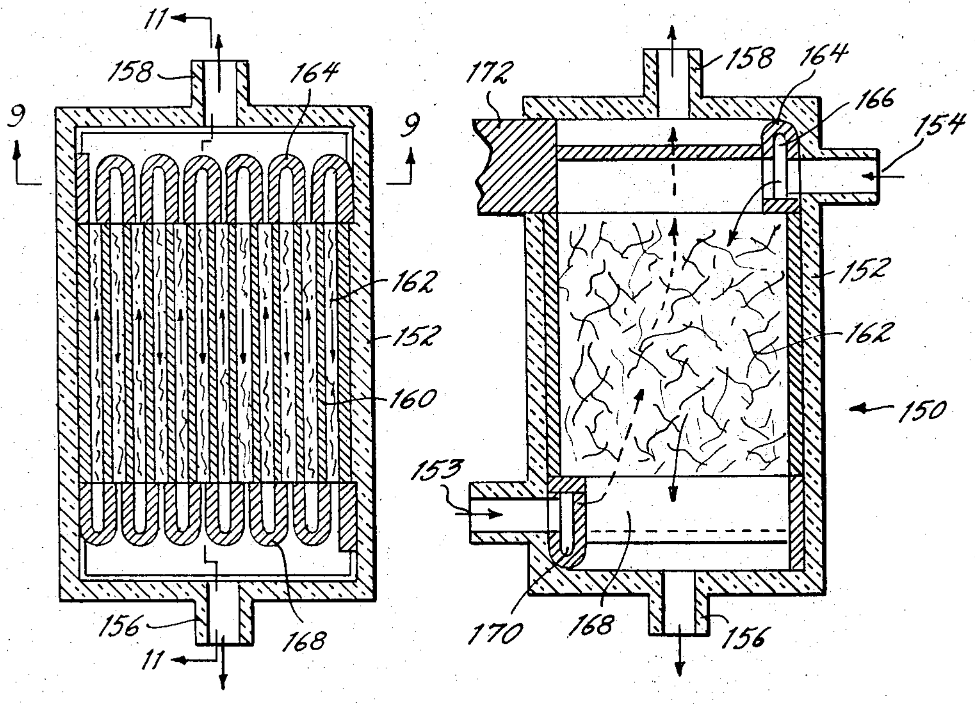

FIGURE 9 is a sectional view taken along the lines 9—9 in FIGURE 10.

FIGURE 10 is a sectional view taken along the lines 10—10 in FIGURE 8.

FIGURE 11 is a sectional view taken along the lines 11—11 in FIGURE 10.

Figures 1, 2:
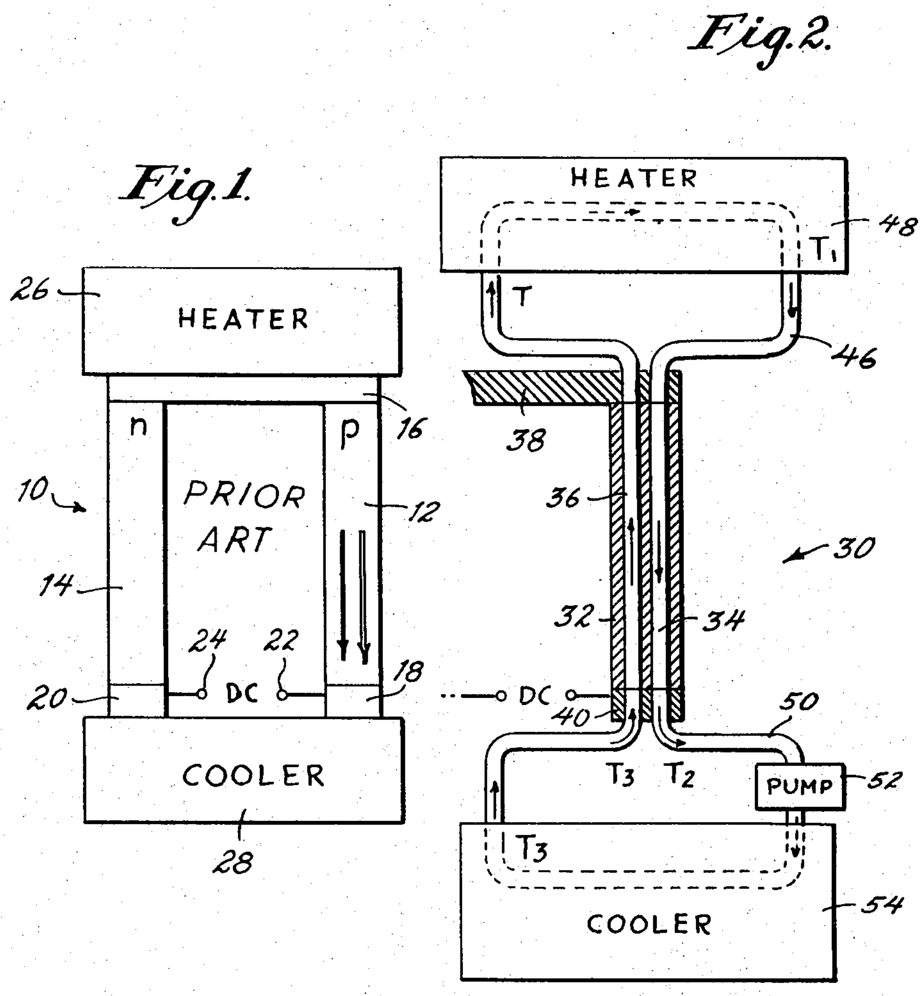
FIGURE 1 is a side elevation view of a conventional thermoelectric cell.
FIGURE 2 is a side elevation view, partly in section, of a thermoelectric element in accordance with the present invention.

Referring to the drawing in detail, wherein like numerals indicate like elements, there is shown in FIGURE 1 a side elevation view of a thermoelectric cell in accordance with the prior art are designated generally as 10.

The cell 10 comprises a thermoelectric element of the positive type 12 and an element 14 of the negative type couple together by a conductor 16 at one end thereof. At the other end of the elements 12 and 14, conductors 18 and 20, respectively, are provided. The conductors 18 and 20 are coupled to the contacts 22 and 24. Heat is introduced into one end of the elements 12 and 14 from a heater 26 and removed from the opposite end of the elements by a cooler 28.

In the cell 10, the thermal gradient between the hot junction at the upper end of the elements and the cold junction at the lower end of the elements is determined by the limited rate of heat absorption and the limited rate of cooling thereof. In order to maintain the required temperature difference, the distance between the hot and cold junctions must have an optimum value. At the optimum value, there is a minimal value of electrical resistance in the elements and a maximum power which can be obtained from the cell 10. Thus, there is a temperature gradient and a heat flow at different incremental points along the length of the elements 12 and 14. As will be made clear hereinafter, the thermoelectric elements of the various embodiments of the present invention have a temperature gradient at incremental points along the length of the elements, but there is no heat flow in the direction of the thermoelectric elements.

In FIGURE 2, there is illustrated an elevation view of a thermoelectric element, partly in section, of the present invention designated generally as 30. The element 30 includes a body 32 of thermoelectric material having spaced parallel passages 34 and 36 extending therethrough. A conductor 38 is coupled to the upper end of the body 32 for connecting the same to another element to form a cell. A conductor 40 is coupled to the lower end of the body 32. The conductor 40 is coupled to a contact 42. Contact 44 will be coupled to a conductor comparable to conductor 40 of the other element of the cell.

It will be noted that the passages 34 and 36 extend through the conductors 38 and 40. Passage 34 is coupled to passage 36 by way of a conduit 46. An intermediate portion of conduit 46 extends through a heater 48. The lower ends of the passages 34 and 36 are in fluid communication by way of a conduit 50. A pump 52 is provided in conduit 50. An intermediate portion of conduit 50 extends through a cooler 54.

The pump 52 circulates a fluid in the closed system illustrated, with the fluid flowing in the direction of the arrows. The circulating fluid should be the electrical insulator, have high heat capacity, low viscosity, a substantially large difference between its boiling and freezing temperatures, should be relatively chemically stable in the temperature and pressure region in which the operation is taking place, and should be inexpensive.

There are a large number of fluids fulfilling the above requirements. Almost all diffusion vacuum pump fluids can be used for this purpose. Thus, the fluid may be a silicone oil or a hydrocarbon oil such as paraffin. The thermal cracking of these oils is slow at temperatures up to 450° C., and they have an operating range for practical operation between 20° C. and 350° C. The use of electrically conductive fluids is possible, but will require electrical insulation in the system. For operation above 450° C., the circulating fluid is preferably a gas.

According to the present invention, one cycle of the fluid will result in the following steps: heating of the fluid by the heater 48, pumping of the heated fluid through passage 34 by pump 52, heat transfer between the fluid in passage 34 and the fluid in passage 36 by conduction through the body 32, cooling of the fluid flowing through passage 34 so that the fluid is cool when it exits passage 34, additional cooling of the fluid in cooler 54, absorption of heat by the fluid as it is passing up passage 36, and additional heating of the fluid in heater 48.

The element 30 will be coupled with a similar element by way of conductor 38 to form a cell. Heretofore, thermoelectric generators had an efficiency of less than four percent. Attempts to increase the efficiency by change of geometry or by cascade systems always led to a decrease of the effective power, thereby making them practically useless as a source of electrical energy. When operating with a hot fluid stream at a temperature of approximately 450° C., with the temperature of the cold stream being 50° C., with perfect heat exchange between the streams transversely across the body 32, the theoretical efficiency of the cell of the present invention is approximately 32 percent. According, it will be seen that the present invention is substantially more efficient than those devices of comparable nature proposed heretofore.

The body 32 of the thermoelectric element or cell of the present invention may be shorter in length than those proposed heretofore, thereby enabling the construction of thermoelectric cells and batteries of higher effective power resulting from two factors. The first factor is the decrease of the barriers limiting heat transfer to and from the hot and cold junctions. This decrease is due to continuous step by step heating and cooling along the entire length of the body 32 thereby providing an increase in the rate of heating without raising the temperature. The second factor is the decrease in the thermal conductivity of the body 32 resulting from the thermal transfer from the hot stream to the cold stream as pointed out above. Hence, while there is a temperature gradient between the hot and cold junctions, there is no heat flow by conduction between the hot and cold junctions in the body 32.

In accordance with the present invention, the thermal transfer occurs through a thin layer of the thermoelectric material of the body 32 with maximum surface area through which the thermal exchange may occur. Hence, the length of the body 32 may be substantially less than that of prior art devices.

Figure 3:
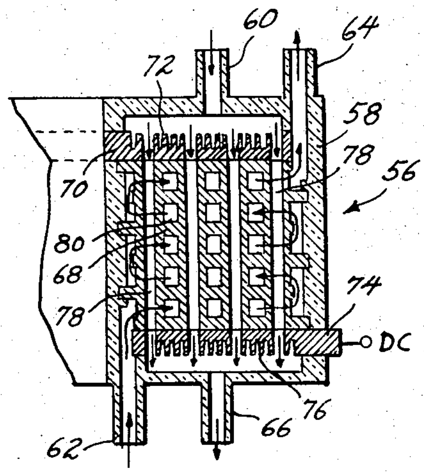
FIGURE 3 is a side elevation view, partly in section, of a thermoelectric element in accordance with another embodiment of the present invention.

In FIGURE 3, there is illustrated a thermoelectric cell in accordance with another embodiment of the present invention designated generally as 56. Element 56 is similar to element 30, however the heater 48, pump 52 and cooler 54 forming a part of the element 56 are not illustrated. The element 56 includes a housing 58 having inlet ports 60 and 62. The housing 58 is also provided with outlet ports 64 and 66.

A body 68 of thermoelectric material corresponding to the body 32 is provided within the housing 58. A conductor 70 extends from the upper end of the body 68 and is adapted to be coupled to a corresponding element of a cell. The upper surface of the conductor 70 is provided with heat exchanging fins 72. A conductor 74 which is adapted to be coupled to a contact is connected to the lower end of the body 68 and is also provided with heat conducting fins 76.

The body 68 is provided with longitudinally extending passages 78 providing communication between ports 60 and 66. The body 68 is also provided with transversely directed passages 80 at spaced points along its length. Adjacent passages at opposite ends thereof are coupled together by a space between the outer periphery of the body 68 and the inner periphery of the housing 58 with radially outwardly directed ribs on the body 68 separating the space as illustrated. Thus, the passages 80 provide communication between the ports 62 and 64.

Ports 60 and 64 are to be connected by a conduit, not shown, passing through a heater (not shown). Such a conduit would be comparable to conduit 46 in FIGURE 2. Likewise, ports 62 and 66 are to be coupled by a conduit having a pump and extending through a cooler as illustrated in FIGURE 2. The last mentioned conduit would be comparable to conduit 50. Thus, the flow of fluid will be as indicated by the arrows in FIGURE 3. The element 56 is more efficient than the element 30 due to the increased surface area of the body 68 exposed to the hot and cold streams, thereby resulting in a more complete thermal transfer between the streams. Otherwise, the operation of the element 56 is identical with the operation of element 30.

Figure 4:
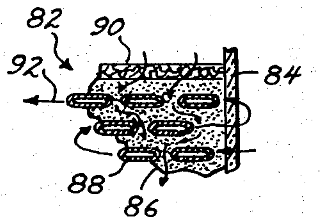
FIGURE 4 is a partial sectional view of a thermoelectric cell in accordance with another embodiment of the present invention.

In FIGURE 4, there is illustrated a partial sectional view of another embodiment of the present invention designated generally at 82. The element 82 includes a housing 84 containing a body of porous thermoelectric material 86. Embedded in the thermoelectric material 86, there is provided a conduit 88 having spaced sections at spaced levels in the body of thermoelectric material 86.

Hot liquid or fluid from a heater is passed through a porous means 90. The hot liquid or fluid passes through the body of porous thermoelectric material 86 and between adjacent portions of the conduit 88, as illustrated by the downwardly directed arrow.

After passing through the body of porous thermoelectric material 86, the hot liquid will then pass through a pump and cooler as described above. Thereafter, the cool liquid will be passed through the conduit 88 in the direction of the arrows and emerge in the direction of arrow 92 for discharge into the heater in the same manner as described above. As the hot liquid is passing downwardly through the body of porous thermoelectric material, there is a thermal transfer to the cold liquid passing through the conduit 88 as described above.

Figure 5:
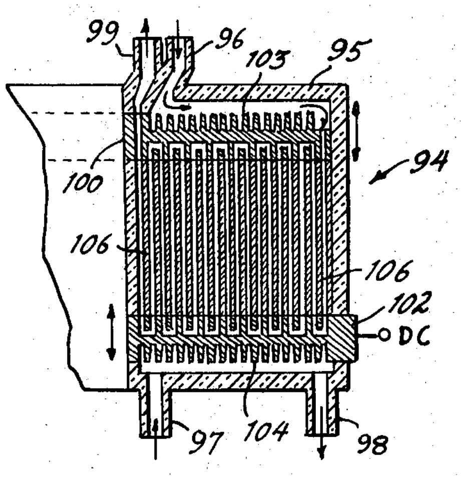
FIGURE 5 is a side elevation view, partly in section, of a thermoelectric element in accordance with another embodiment of the present invention.

In FIGURE 5, there is illustrated an element in accordance with another embodiment of the present invention designated generally as 94. The element 94 includes a housing 95 having inlets 96 and 97 and outlets 98 and 99.

Within the housing 95, there are provided an upper conductor 100 and a lower conductor 102. Conductor 100 is provided with upwardly directed fins 103 and conductor 102 is provided with downwardly directed fins 104. Between the conductors 100 and 102, there is provided a plurality of spaced parallel upright plates of thermoelectric material 106. The conductors 100 and 102 are provided with U-shaped passages which provided communication between channels on opposite sides of the plates 106.

Inlet 96 and outlet 99 are adapted to be in communication by way of a conduit extending through a heater as described above. Inlet 97 and outlet 98 are adapted to be in communication by way of a conduit extending through a cooler as described above. Each of the two last-mentioned conduits will have a pump therein to provide for circulation of the fluids. Fluids entering inlet 96 pass through the channels in a zigzag fashion as illustrated. The fluid as it is passing downwardly transfers heat to the fluid as it is passing upwardly on the opposite side of the adjacent plate 106. Since the bottom conductor 102 will be cold as a result from the circulation of fluid from inlet 97 to outlet 98, the hot fluid will be cooled as it is passing downwardly and will reach its lowest temperature as it passes through the U-shaped passage in the conductor 102. As the cooled fluid is passing upwardly through the next channel, its temperature will be increased by a thermal transfer through the adjacent plate of thermoelectric material 106.

Thus, the fluid will continue through the zigzag passages, constantly being reheated and cooled, and ultimately will be discharged through the outlet 99. Thus, it will be seen that element 94 involves two closed circulating systems and otherwise functions as described above.

The thermoelectric element in accordance with the present invention may be in the form of a sandwich as illustrated in FIGURES 6 and 7*a* and designated generally as 108. Element 108 includes a housing 110 having inlets 112 and 114, as well as outlets 116 and 118.

The element 108 is identical with element 56 except as will be described hereinafter. Element 108 differs from element 56 by the provision of a sandwich built from thin layers of semiconducting material of high Siebeck coefficients alternated with thin layers of good conducting metal 122. A porous metallic filter 124 is disposed in the aligned passages through the metal conductor 122. A porous semiconductor 126 is provided in the aligned passages in the layer of thermoelectric material 120. The main part of the heat exchange takes place in the layers of conductive metal 122. The total drop of the temperature takes place on the layers of thermoelectric material 120 as well as the total drop of electrical potential.

The hot stream very quickly exchanges its heat with the porous metallic filter 124 which is in thermal equilibrium with the cold stream flowing through the metal conductor 122. The average specific resistance of element 108 is approximately one-third of the average specific resistance of the element 82, assuming that the contact resistances between the conductors and the layers of thermoelectric material 120 are negligible.

In order to materially reduce the electrical contact resistance and improve the heat exchange between the conductor and the body of thermoelectric material, an additional body 128 is placed between these two as is indicated in FIGURE 8*b*. This body is prepared by sintering powder of the same material as conductor 130 having a porosity of about fifty percent. The porous material is then filled with thermoelectric material 132. This arrangement as illustrated in FIGURE 8*b* should be compared with the conventional joint between a conductor and a body of thermoelectric material as illustrated in FIGURE 8*a*. Due to use of a porous conductor with the high specific area in contact with the semiconductor, the area of heat exchange between the two materials is increased and electrical resistivity of contact decreased.

In FIGURE 7, there is illustrated another embodiment of the present invention wherein a battery comprised of three cells connected in series is designated generally as 134. The battery 134 includes a heater 48' and a cooler 54'. Between the heater and cooler, there are provided three cells 136, 138 and 140. Each of these cells is composed of two elements corresponding generally to the element 30 illustrated in FIGURE 2. In view of the above description with respect to FIGURE 2, it is not deemed necessary to describe the cells in detail.

The battery 134 includes a pump 52' driven by a motor 142. The pump 52' is coupled to the inlet and outlet ends of a conduit 144 and circulates a fluid in the direction of the arrows illustrated in FIGURE 7. Terminals 146 and 148 are coupled to the conductors at the cold junctions at the terminal ends of the battery. The motor 142 is coupled across the terminals 146 and 148 so that a portion of the current for running the motor 142 is derived from the output of the battery 134. It is believed that the battery 134 will be sufficiently clear from the description above and the operation of the same need not be described in view of the description with respect to FIGURE 2.

In FIGURES 8–11, there is illustrated another embodiment of the present invention wherein a thermoelectric element is designated generally as 150. The element 150 includes a housing 152 having inlets 153 and 154. Housing 152 is also provided with outlets 156 and 158.

Within the housing 152, there is provided a plurality of spaced parallel plates of thermoelectric material 160 spaced from one another by layers 162 of porous sintered thermoelectric material. A top header 164 is provided above the plates 160 and has a plurality of channels in line with alternate layers 162. Header 164 has a manifold in communication with inlet 154 and the channels in header 164. A bottom header 168 is provided below the plates 160. The bottom header has a plurality of channels in communication with the remaining layers 162 and its channels are in communication with the inlet 153 by way of manifold 170.

The outlets 156 and 158 are at opposite ends of the housing 152. Inlet 154 and outlet 158 are adapted to be in communication by way of a conduit extending through a heater as described above. Inlet 153 and outlet 156 are adapted to be in communication by way of a conduit passing through a pump and cooler as described above. The hot junction of element 150 is connected to a corresponding element by way of a conductor 172. The flow of the hot fluid follows the downwardly directed arrows and the cold fluid follows the direction of the upwardly extending arrows as illustrated in FIGURES 10 and 11. In view of the above remarks, it is not deemed necessary to describe the operation of the element 150.

The present invention may be embodied in other specific forms without departing from the spirit or essential attributes thereof and, accordingly, reference should be made to the appended claims, rather than to the foregoing specification as indicating the scope of the invention.

I claim:

1. In a thermoelectric generator comprising a first arm of P-type thermoelectric material, a second arm of N-type thermoelectric material, a hot junction conductor coupling one end of each of said arms together, an electric terminal at the opposite end of each of said arms, two fluid flow passages extending through each of said arms of thermoelectric material, first means for coupling one end of each of said fluid flow passages in communication with each other, fluid heating means for heating fluid flowing through said first coupling means, second means for coupling the other end of each of said fluid flow passages in communication with each other, fluid cooling means for cooling fluid flowing through said second coupling means, said two passages being closely adjacent to each other throughout their lengths, the terminus of each of said passages adjacent the first coupling means defining a hot junction for said thermoelectric generator and the terminus of each of said passages adjacent the second coupling means defining a cold junction for said thermoelectric generator, and means for circulating fluid from said first coupling means through one of said passages to said second coupling means and from said second coupling means through the other of said passages back to said first coupling means, whereby heat is transferred from fluid flowing from said first coupling means to said second coupling means through the thermoelectric material separating said passages to fluid flowing from said second coupling means to said first coupling means.

2. A thermoelectric generator in accordance with claim 1 including a second cell, said cells being coupled together in series to form a battery.

3. A thermoelectric generator in accordance with claim 1 wherein said thermoelectric material includes spaced substantially parallel plates.

4. A thermoelectric generator in accordance with claim 1 wherein the second passage lies in a horizontal plane with the first passage lying in a substantially vertical plane.

5. A thermoelectric generator in accordance with claim 1 wherein said passages are parallel to one another.

6. A thermoelectric generator in accordance with claim 1 wherein said body of thermoelectric material is a porous sintered mass.

References Cited

UNITED STATES PATENTS

| | | | |
|---|---|---|---|
| 2,937,218 | 5/1960 | Sampietro | 136—211 |
| 2,993,080 | 7/1961 | Poganski | 136—204 |
| 3,040,113 | 6/1962 | Lindenblad | 136—211 |
| 3,054,840 | 9/1962 | Alsing | 136—204 |
| 3,056,848 | 10/1962 | Meyers | 136—210 |
| 3,116,167 | 12/1963 | Talaat | 136—210 |

FOREIGN PATENTS

| | | |
|---|---|---|
| 1,264,219 | 5/1961 | France. |

ALLEN B. CURTIS, *Primary Examiner.*

MARVIN O. HIRSCHFIELD, *Examiner.*

J. A. HINKLE, *Assistant Examiner.*